United States Patent
Nogi et al.

(10) Patent No.: US 8,588,962 B2
(45) Date of Patent: Nov. 19, 2013

(54) VACUUM PROCESSING DEVICE AND METHOD OF TRANSPORTING PROCESS SUBJECT MEMBER

(71) Applicant: Hitachi High-Technologies Corporation, Tokyo (JP)

(72) Inventors: Keita Nogi, Tokyo (JP); Teruo Nakata, Yokohama (JP); Yoshiro Suemitsu, Kudamatsu (JP); Michinori Kawaguchi, Shunan (JP); Satomi Inoue, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/633,155

(22) Filed: Oct. 2, 2012

(65) Prior Publication Data

US 2013/0108400 A1 May 2, 2013

(30) Foreign Application Priority Data

Nov. 2, 2011 (JP) ................................ 2011-241068

(51) Int. Cl.
*G06F 7/00* (2006.01)
(52) U.S. Cl.
USPC ........................................................ 700/228
(58) Field of Classification Search
None
See application file for complete search history.

(56) References Cited

FOREIGN PATENT DOCUMENTS

JP 2009-94530 4/2009

OTHER PUBLICATIONS

U.S. Appl. No. 13/729,432, filed Jul. 2013, Mizuguchi.*
U.S. Appl. No. 13/479,518, filed Nov. 2012, Nakata et al.*
U.S. Appl. No. 12/054,160, filed Sep. 2008, Price et al.*
U.S. Appl. No. 11/877,303, filed May 2011, Pannese et al.*

* cited by examiner

*Primary Examiner* — Yolanda Jones
(74) *Attorney, Agent, or Firm* — Antonelli, Terry, Stout & Kraus, LLP.

(57) ABSTRACT

Transportation control in a vacuum processing device with high transportation efficiency without lowering throughput is provided. A control unit is configured to update in real time and holds device state information showing an action state of each of a process chamber, a transportation mechanism unit, a buffer room, and a holding mechanism unit, the presence of a process subject member, and a process state thereof; select a transport algorithm from among transport algorithm judgment rules that are obtained by simulating in advance a plurality of transport algorithms for controlling transportation of a process subject member for each condition of a combination of the number and arrangement of the process chambers and process time of a process subject member based on the device state information and process time of the process subject member; and compute a transport destination of the process subject member based on the selected transport algorithm.

6 Claims, 16 Drawing Sheets

| PORTION | STATE | WAFER NUMBER | WAFER STATE |
|---|---|---|---|
| FOUP 201_STEP 1 | — | W1 | PROCESSED |
| FOUP 201_STEP 2 | — | AVAILABLE | — |
|  |  |  |  |
| FOUP 201_STEP 25 | — | W25 | UNPROCESSED |
| FOUP 202_STEP 1 | — | W26 | UNPROCESSED |
|  |  |  |  |
| FOUP 201_STEP 25 | — | W50 | UNPROCESSED |
| ATMOSPHERIC ROBOT 203 | IN TRANSPORTATION | W12 | UNPROCESSED |
| LAOD LOCK 211_STEP 1 | VACUUM | W10 | UNPROCESSED |
|  |  |  |  |
| LOAD LOCK 211_STEP 5 | VACUUM | W2 | PROCESSED |
| PROCESS CHAMBER 205 | IN PROCESS | W5 | IN PROCESS |
| PROCESS CHAMBER 206 | CLEANING | AVAILABLE | — |
|  |  |  |  |
| PROCESS CHAMBER 210 | STAND-BY | AVAILABLE | — |
| VACUUM ROBOT 217_HAND 1 | STAND-BY | AVAILABLE | — |
| VACUUM ROBOT 217_HAND 2 | IN TRANSPORTATION | W3 | PROCESSED |
| VACUUM ROBOT 218_HAND 1 | IN TRANSPORTATION | W8 | UNPROCESSED |
| VACUUM ROBOT 218_HAND 2 | IN TRANSPORTATION | W7 | UNPROCESSED |
| VACUUM ROBOT 219_HAND 1 | STAND-BY | AVAILABLE | — |
| VACUUM ROBOT 219_HAND 2 | STAND-BY | AVAILABLE | — |
| BUFFER ROOM 212_STEP 1 |  | W4 | PROCESSED |
|  |  |  |  |
| BUFFER ROOM 212_STEP 5 |  | AVAILABLE | — |
| BUFFER ROOM 213_STEP 1 |  | W6 | UNPROCESSED |
|  |  |  |  |
| BUFFER ROOM 213_STEP 5 |  | AVAILABLE | — |

| WAFER NUMBER | TRANSPORT DESTINATION |
|---|---|
| W1 | PROCESS CHAMBER 205 |
| W2 | PROCESS CHAMBER 207 |
| W3 | PROCESS CHAMBER 206 |
| W4 | PROCESS CHAMBER 209 |
| W5 | PROCESS CHAMBER 205 |
| W6 | PROCESS CHAMBER 208 |
| W7 | PROCESS CHAMBER 206 |
| ⋮ | ⋮ |

| ACTION INSTRUCTION | ACTION INSTRUCTION CONDITION |
|---|---|
| TRANSPORT FROM LOAD LOCK 211 TO PROCESS CHMBER 205 | THERE IS UNPROCESSED WAFER WHOSE TRANSPORT DESTINATION IS PROCESS CHAMBER 205 IN LOAD LOCK 211, WHICH IS IN VACUUM STATE |
| | PROCESS CHAMBER 205 IS IN STAND-BY STATE |
| | AT LEAST ONE HAND OF VACUUM ROBOT 217 IS IN STAND-BY STATE |
| TRANSPORT FROM LOAD LOCK 211 TO BUFFER ROOM 212 | THERE IS UNPROCESSED WAFER WHOSE TRANSPORT DESTINATION IS OTHER THAN PROCESS CHAMBERS 205, 206 IN LOAD LOCK 211, WHICH IS IN VACUUM STATE |
| | THERE IS AVAILABLE STEP IN BUFFER ROOM 212 |
| | AT LEAST ONE HAND OF VACUUM ROBOT 217 IS IN STAND-BY STATE |
| TRANSPORT FROM PROCESS CHAMBER 205 TO LOAD LOCK 211 | THERE IS PROCESSED WAFER IN PROCESS CHAMBER 205 |
| | THERE IS AVAILABLE STEP IN LOAD LOCK 211, WHICH IN VACUUM STATE |
| | AT LEAST ONE HAND OF VACUUM ROBOT 217 IS IN STAND-BY STATE |
| ⋮ | ⋮ |

| TRANSPORTING PORTION | TRANSPORT SUBJECT | TRANSPORTED FROM | TRANSPORT DESTINATION |
|---|---|---|---|
| VACUUM ROBOT 217 HAND 1 | W10 | LOAD LOCK 211_STEP 1 | BUFFER ROOM 212_STEP 5 |
| VACUUM ROBOT 219 HAND 1 | W6 | BUFFER ROOM 213_STEP 1 | PROCESS CHAMBER 210 |

| ACTION ORDER | PORTION | ACTION |
|---|---|---|
| 1 | LOAD LOCK 211 | OPEN VACUUM SIDE GATE VALVE 221 |
| 1 | VACUUM ROBOT 217 | ROTATE TO FACE DIRECTION OF LOAD LOCK 211 |
| 2 | VACUUM ROBOT 217 | TAKE OUT WAFER FROM LOAD LOCK 211 |
| 3 | VACUUM ROBOT 217 | ROTATE TO FACE DIRECTION OF BUFFER ROOM 212 |
| 3 | BUFFER ROOM 211 | OPEN GATE VALVE 224 ON SIDE OF TRANSPORT CHAMBER 214 |
| 3 | LOAD LOCK 211 | CLOSE VACUUM CHAMBER GATE VALVE 211 |
| 4 | VACUUM ROBOT 217 | PLACE WAFER IN BUFFER ROOM 212 |
| 5 | BUFFER ROOM 212 | CLOSE GATE VALVE 224 ON SIDE OF TRANSPORT CHAMBER 214 |

| PORTION | EVENT |
|---|---|
| PROCESS CHAMBER | PROCESS ENDS |
| PROCESS CHAMBER | ABNORMALITY OCCURS IN PROCESS CHAMBER |
| PROCESS CHAMBER | PROCESS STARTS FOR NEW LOT |
| FOUP | PROCESS ON ALL WAFERS IN LOT ENDS |
| ⋮ | ⋮ |

| WAFER NUMBER | PROCESS TIME |
|---|---|
| W1 | 40 |
| W2 | 40 |
| W3 | 40 |
| W4 | 40 |
| W5 | 40 |
| W6 | 40 |
| W7 | 40 |
| ⋮ | ⋮ |

| TRANSPORT ALGORITHM | CONDITION FOR DECIDING TRANSPORT DESTINATION BASED ON TRANSPORT ALGORITHM |
|---|---|
| TRANSPORT ALGORITHM 1 | PRIORITY ORDER FOR TRANSPORTATION TO EACH PROCESS CHAMBER IN SAME LINK IS IN ORDER FROM SMALLER PROCESS CHAMBER NUMBERS<br>L1:L2:L3 = 1:2:1<br>PRIORITY ORDER FOR DISTRIBUTION TO VACUUM ROBOTS IS IN ORDER FROM SMALLER VACUUM ROBOT NUMBERS |
| TRANSPORT ALGORITHM 2 | PRIORITY ORDER FOR TRANSPORTATION TO EACH PROCESS CHAMBER IN SAME LINK IS IN ORDER FROM SMALLER PROCESS CHAMBER NUMBERS<br>L1:L2:L3 = 2:1:0<br>PRIORITY ORDER FOR DISTRIBUTION TO VACUUM ROBOTS IS IN ORDER FROM SMALLER VACUUM ROBOT NUMBERS |
| ... | ... |

| CONDITION OF PROCESS TIME | | | | | | THROUGHPUT ESTIMATE VALUE | | TRANSPORT ALGORITHM TO BE SELECTED |
|---|---|---|---|---|---|---|---|---|
| PROCESS CHAMBER 205 | PROCESS CHAMBER 206 | PROCESS CHAMBER 207 | PROCESS CHAMBER 208 | PROCESS CHAMBER 209 | PROCESS CHAMBER 210 | TRANSPORT ALGORITHM 1 | TRANSPORT ALGORITHM 2 | |
| 25 (s) | 25 (s) | 10 (s) | 10 (s) | – | – | 0.01 | 0.018 | TRANSPORT ALGORITHM 2 |
| 40 (s) | 40 (s) | 40 (s) | 40 (s) | – | – | 0.03 | 0.02 | TRANSPORT ALGORITHM 1 |
| ... | | | | | | | | |

FIG. 21

| PROCESS CHAMBER NUMBER | ACTIVATION STATUS | PROCESS END HISTORY |
|---|---|---|
| PROCESS CHAMBER 205 | ACTIVE | 1 |
| PROCESS CHAMBER 206 | ACTIVE | 2 |
| PROCESS CHAMBER 207 | ACTIVE | 3 |
| PROCESS CHAMBER 208 | ACTIVE | 4 |
| PROCESS CHAMBER 209 | TERMINATED | – |
| PROCESS CHAMBER 210 | TERMINATED | – |

2101

VACUUM PROCESSING DEVICE AND METHOD OF TRANSPORTING PROCESS SUBJECT MEMBER

CLAIM OF PRIORITY

The present application claims priority from Japanese application serial no. JP2011-241068, filed on Nov. 2, 2011, the content of which is hereby incorporated by reference into this application.

BACKGROUND OF THE INVENTION

1) Field of the Invention

The present invention relates to a vacuum processing device that is used to process a substrate-like wafer such as a semiconductor wafer and a liquid crystal display, and performs processes such as fine patterning using a plurality of types of gas, and a method of transporting a sample that is a process subject in the vacuum processing device.

2) Description of the Related Art

A vacuum processing device includes a processing unit including a vacuum container having a vacuum process chamber therein, an evacuation device, a plasma forming device and the like, and productivity is required to be improved with lower costs for such a vacuum processing device. It is an important task to make process efficiency per device higher by improving throughput (the number of substrates processed per unit time) as a representative example of productivity indices. In the following, a semiconductor processing device is explained as an example just like a sample to be a process subject in a vacuum processing device is called a wafer, but the present invention is not limited to a semiconductor processing device. Also, although throughput is explained as a representative example of productivity indices, the same applies to another productivity index such as a turn-around time, and the present invention is not limited to throughput.

In a process of a semiconductor processing device which is one application a vacuum processing device, there is a step of a process performed on a wafer such as a semiconductor wafer that is a process subject wafer under vacuum such as a plasma process including an etching process, and in order to perform such a process with high throughput, namely, to improve process efficiency per device, a semiconductor processing device in which a plurality of process chambers is installed is used. Normally, a known semiconductor processing device includes a vacuum process chamber and an atmospheric transport chamber that is under a normal pressure.

A cassette (FOUP) that houses a predetermined number of wafers, for example 25, is attached to a front surface side of the above-described semiconductor processing device, a transportation robot takes out wafers from the cassette one by one to transport the wafers to a load lock to switch from atmospheric pressure to vacuum, the wafers are carried from the load lock in which pressure is reduced by vacuum evacuation into any of vacuum process chambers where a process is performed via a transportation path with reduced pressure, and then the process is performed. When the process ends, the wafers are carried out to go through the path that the wafers went through when they were carried in in a reverse direction to return to a space under atmospheric pressure via the load lock. Thereafter, the wafers return to the same positions in the same cassette where the wafers were before they were carried out by the transportation robot. This is a general order of actions when a semiconductor processing device processes a wafer.

As such a semiconductor processing device, a device with a structure called a cluster tool in which a vacuum process chamber is connected radially around a transport chamber is widely used. However, the cluster tool device requires a large installation area, and in particular with an increase in diameters in recent years, the installation area has been becoming larger and larger. To cope with the problem, a device with a structure called a linear tool has appeared to realize both a smaller installation area and improved throughput. A characteristic of the linear tool is that it has a plurality of transport chambers, a vacuum process chamber is connected to each transport chamber, and the transport chambers are mutually connected directly or interposing spaces for passing wafers (hereinafter, buffer room) therebetween.

The linear tool has a mechanism that allows transportation of wafers by a plurality of transportation robots to a plurality of vacuum process chambers in parallel by including the plurality of transportation robots the number of which used to be one in a conventional semiconductor processing device, thus realizing high throughput.

Although a structure of the linear tool that realizes improvement of throughput while making an installation area smaller has been proposed, a technique for shortening process time and making transportation efficient is also important for throughput improvement. However, transportation control having been applied to a cluster tool is targeted at a single transportation robot, and when the transportation control is applied as it is for a linear tool including a plurality of transportation robots, throughput is lowered in some cases.

As a representative method of transportation control in a cluster tool, there is a procedure of control by transporting wafers to process chambers starting in order with those where processes have ended earlier. When the procedure is applied to a linear tool, it is possible to realize high throughput if process time required for processing wafers is approximately the same for process chambers. However, if different types of products are processed in parallel in process chambers, process time in each process chamber depends on the type of a product, and timing at which each process ends differs often.

In such a situation, it may be possible to conceive of simply transporting a next wafer just after a process in a process chamber among a plurality of process chambers ends. At this time, when process time of a wafer to be transported next to a process chamber where a process has ended is long, although it may depend on the number and arrangement of process chambers in the semiconductor processing device, a transportation path for a wafer planned to be processed in a process chamber whose process time is short may be blocked, meaning that the wafer should have been transported to the process chamber beforehand. As a result, throughput is lowered.

One effective means to improve throughput of a vacuum processing device in which a plurality of process chambers is installed is to disperse loads of transportation robots. For this purpose, Japanese Patent Application Laid-Open Publication No. 2009-94530 discloses that higher throughput as compared with a conventional vacuum processing device is realized by providing a plurality of transportation robots the number of which used to be one in the conventional device, and transporting wafers to a plurality of vacuum process chambers in parallel. However, regarding a section to control the plurality of transportation robots, Japanese Patent Application Laid-Open Publication No. 2009-94530 only mentions that the transportation robots pass wafers among them. In an actual operation of a semiconductor processing device, process time in a process chamber differs depending on a wafer processed in the process chamber. Also, for this reason, a transportation control procedure of transporting wafers simply to process chambers starting in order with those where processes have ended earlier in a linear tool including a plurality of transportation robots has a problem that throughput is lowered in some cases depending on process time of wafers processed in each process chamber.

Also, an efficient transportation method differs depending on a step of a process on a wafer in some cases. One process step may complete by a single process in a process chamber, and another process step may complete by performing processes a plurality of times. Furthermore, an efficient transportation method differs depending on operation conditions. Under one operation condition, a process chamber where a wafer is planned to be processed may be changed freely at any time, and under another operation condition, a process chamber where a process is planned may not be changed once transportation of a wafer is started from an initial position. The operation condition that a process chamber where a wafer is planned to be processed is changed freely at any time means that process conditions such as types of gas to be used in processes are the same for a plurality of process chambers, and quality of a wafer after a process is not affected no matter in which process chamber the wafer is processed. Also, the operation condition that a process chamber where a process is planned may not be changed once transportation of a wafer is started from an initial position means that although process conditions such as types of gas to be used in processes are the same for a plurality of process chambers, an 121 of minute adjustment of process conditions according to a wafer-specific state such as film thickness is performed once a process chamber where a wafer is planned to be processed is decided or process conditions such as types of gas to be used in processes are different for process chambers.

SUMMARY OF THE INVENTION

An object of the present invention is to include a linear-tool type semiconductor processing device that includes transportation control with high transportation efficiency when different types of products are processed in parallel in process chambers regardless of the number and arrangement of the process chambers under an operation condition that a process chamber where a process is planned cannot be changed once transportation of a wafer is started from an initial position in a process step that completes by performing a process once in a process chamber.

In order to address the problems, a vacuum processing device according to an aspect of the present invention includes: a load lock that takes in a process subject member placed on an atmosphere-side to a vacuum-side; a plurality of process chambers that are connected to a transport chamber provided on the vacuum-side and perform a predetermined process on the process subject member; a plurality of transportation mechanism units that include a vacuum robot that performs passing and transportation of the process subject member; a plurality of buffer rooms that interconnect the transportation mechanism units and in which the process subject member is placed to be relayed; a holding mechanism unit that provided in the load locks and the buffer rooms and holds a plurality of the process subject members; and a control unit that controls passing and transportation of the process subject member, wherein the control unit updates in real time and holds device state information showing an action state of each of the process chambers, the transportation mechanism units, the buffer rooms, and the holding mechanism unit, the presence of the process subject member, and a process state thereof, the control unit having a section that selects a transport algorithm from among transport algorithm judgment rules that are obtained by simulating in advance a plurality of transport algorithms for controlling transportation of the process subject member for each condition of a combination of the number and arrangement of the process chambers and process time of a process subject member based on the device state information and process time of the process subject member; and a section that computes a transport destination of the process subject member based on the selected transport algorithm.

In order to address the problems, in the vacuum processing device according to an aspect of the present invention, the section of the control unit that selects the transport algorithm reads out process chamber information about an activation state from the device state information, and selects a transport algorithm that is predicted to provide a highest throughput value from among transport algorithm judgment rules that are obtained by simulating in advance a plurality of transport algorithms for controlling transportation of the process subject member for each condition of a combination of the number and arrangement of the process chamber and process time of a process subject member based on the device state information and process time of the process subject member.

Also, in order to address the problems, in the vacuum processing device according to an aspect of the present invention, assuming that the transportation mechanism units are classified into a first transportation mechanism unit that performs direct passing and transportation of the process subject member from the load lock to the process chamber; a second transportation mechanism unit that receives the process subject member from the load lock via the first transportation mechanism unit and the buffer room, and passes and transports the process subject member to a process chamber; a third transportation mechanism unit that receives the process subject member from the second transportation mechanism unit via the buffer room, and passes and transports the process subject member to a process chamber; and an n-th transportation mechanism unit, a plurality of transport algorithms for controlling transportation of the process subject member is defined by a ratio of the number of the process subject members that are passed and transported to a process chamber by the first transportation mechanism unit; the number of the process subject members that are passed and transported to a process chamber by the second transportation mechanism unit; the number of the process subject members that are passed and transported to a process chamber by the third transportation mechanism unit; and the number of the process subject members that are passed and transported to a process chamber by the n-th transportation mechanism unit, the numbers of the process subject members being obtained by dividing the number of the process subject members transported from the load lock.

The present invention provides a vacuum processing device that provides transportation control with high transportation efficiency under any process condition of the number and arrangement of process chambers, process time in the process chambers and the like.

BRIEF DESCRIPTION OF THE DRAWINGS

FIG. 11 is a table that shows an example of device state information;

FIG. 12 is a table that shows an example of transport destination information;

FIG. 13 is a table that shows an example of action instruction rule information;

FIG. 14 is a table that shows an example of action instruction information;

FIG. 15 is a table that shows an example of action instruction rule information;

FIG. 16 is a table that shows an example of transport destination calculation triggers;

FIG. 17 is a table that shows an example of process subject information;

FIG. 18 is a table that shows an example of a transport algorithm library;

FIG. 19 is a table that shows an example of transport algorithm judgment rules;

FIG. 21 is a table that shows an example of process chamber information.

DETAILED DESCRIPTION OF THE PREFERRED EMBODIMENTS

Figure 1:
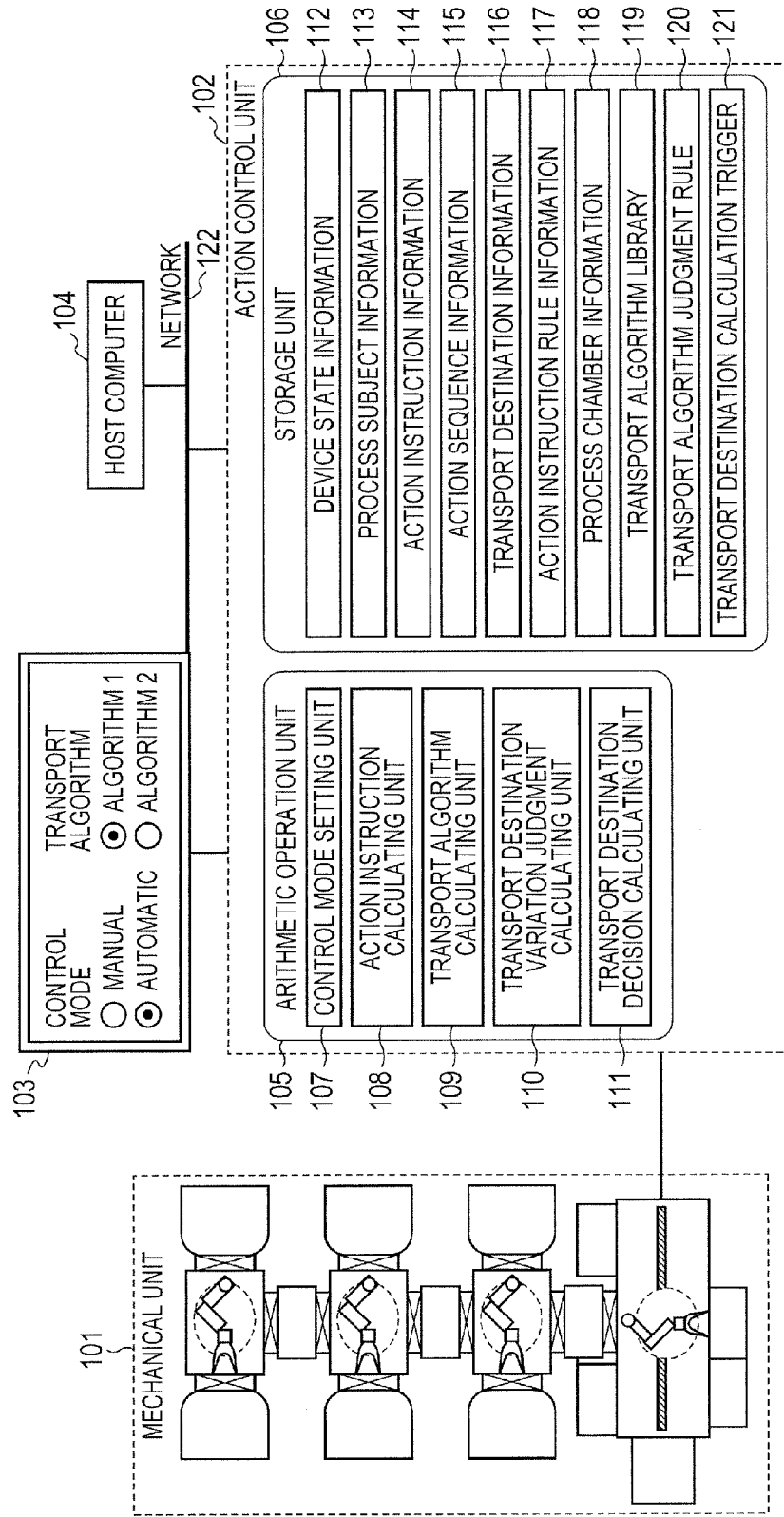
FIG. 1 is a diagram that explains an outline of an overall configuration of a semiconductor processing device.

Hereinafter, an embodiment of the present invention is explained with reference to drawings.

An outline of an overall configuration of a semiconductor processing device according to the present invention is explained with reference to FIG. 1. The semiconductor processing device is composed of, explaining roughly, a mechanical unit 101 including a process chamber and a transportation mechanism, an action control unit 102, and a console terminal 103. The mechanical unit 101 is configured with a process chamber that can perform processes such as etching and deposition on wafers, and a transportation mechanism included a robot and the like that performs transportation of the wafers. The action control unit 102 is a controller that controls actions of the process chamber and the transportation mechanism, and is composed of an arithmetic operation unit 105 that performs arithmetic operation processes and a storage unit 106 that stores various types of information.

The arithmetic operation unit 105 includes: a control mode setting unit 107 that switches processes inside a control system according to a control mode of "Manual" or "Automatic" designated by a user; an action instruction calculating unit 108 that performs arithmetic operations for making the process chamber and the transportation mechanism act actually; a transport algorithm calculating unit 109 that performs calculation for selecting a transport algorithm from among a plurality of algorithms; a transport destination variation judgment calculating unit 110 that performs calculation for judging whether to calculate a transport destination; and a transport destination decision calculating unit 111 that performs calculation to decide a process chamber to which each wafer is transported based on a selected transport algorithm.

In the storage unit 106, information such as device state information 112, process subject information 113, action instruction information 114, action sequence information 115, transport destination information 116, action instruction rule information 117, process chamber information 118, a transport algorithm library 119, transport algorithm judgment rules 120, and transport destination calculation triggers 121 are stored.

The console terminal 103 is for a user to input a control method, and confirm a state of a device, and includes input equipment such as a keyboard, a mouse, and a stylus, and a screen that outputs information. Also, the semiconductor processing device is connected to a host computer 104 via a network 122, and can download from the host computer 104 necessary information including a recipe such as a type and concentration of gas utilized for a process and standard time required for the process when necessary.

Figure 2:
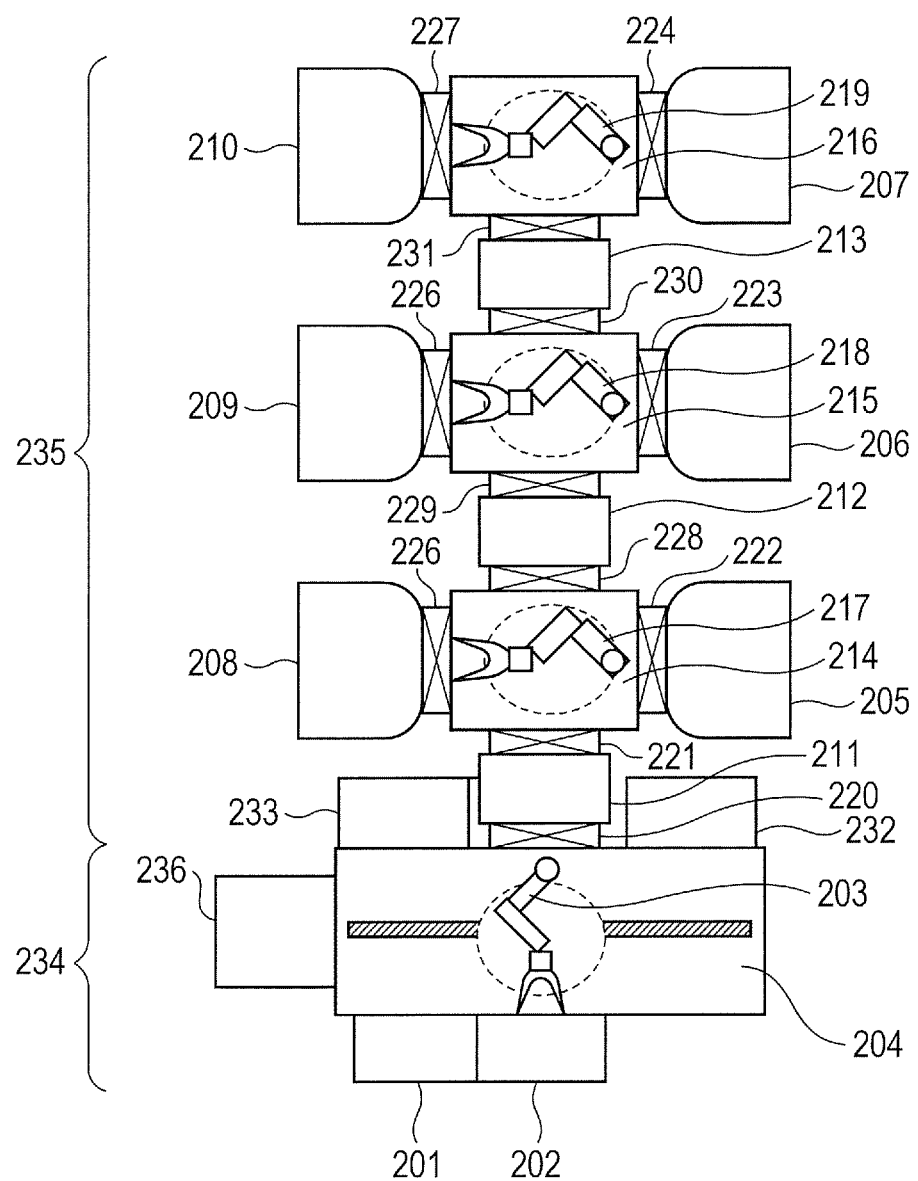
FIG. 2 is a diagram that explains a configuration of a mechanical unit of the semiconductor processing device.

Next, a configuration of the mechanical unit including the process chamber and the transportation mechanism is explained with reference to FIG. 2. FIG. 2 is a bird's-eye view of the mechanical unit seen from a top surface thereof. The mechanical unit is roughly divided into an atmosphere-side mechanical unit 234 and a vacuum-side mechanical unit 235. The atmosphere-side mechanical unit 234 performs transportation and the like of wafers such as taking out a wafer from a cassette where the wafer is housed, and housing a wafer in the cassette under atmospheric pressure. The vacuum-side mechanical unit 235 performs transportation of a wafer under pressure that is reduced from the atmospheric pressure, and performs a process in a process chamber. Then, a load lock 211 in which pressure is increased and decreased between the atmospheric pressure and vacuum in a state that a wafer is retained therein is included between the atmosphere-side mechanical unit 234 and the vacuum-side mechanical unit 235, and the load lock 211 mediates distribution of wafers to either the atmosphere-side mechanical unit 234 or the vacuum-side mechanical unit 235.

The atmosphere-side mechanical unit 234 includes load ports 201, 202, an aligner 236, evacuation stations 232, 233 for evacuation of a processed wafer temporarily, an atmospheric robot 203, and a housing 204 that covers a movable area of the atmospheric robot. A cassette (FOUP) housing a process subject wafer is placed on the load ports 201, 202. Then, the atmospheric robot 203 having a hand that can hold a wafer takes out a wafer housed in the cassette to transport the wafer into the load lock 211, or conversely takes out a wafer from inside the load lock 211 to house the wafer in the cassette (FOUP). Also, the atmospheric robot 203 houses a wafer taken out from the load lock 211 in the evacuation stations 232, 233, or house a wafer taken out from the evacuation stations 232, 233 in the cassette. This atmospheric robot 203 can expand and contract a robot arm, move the robot arm vertically, and rotate the robot arm; furthermore, the atmospheric robot 203 can move inside the housing 204 horizontally. Also, the aligner 236 is a machine for aligning orientations of wafers. It is of note that the atmosphere-side mechanical unit 234 is merely an example, and the device of the present invention is not limited to a device having two load ports, but the number of load ports may be less than or more than two. In addition, the device of the present invention is not limited to a device having one atmospheric robot, but may have a plurality of atmospheric robots. In addition, the device of the present invention is not limited to a device having one aligner, but may have a plurality of aligners, or may not have an aligner. In addition, the device of the present invention is not limited to a device having the two evacuation stations for temporary evacuation of wafers so that the number matches with the number of the load ports, but may have more than or less than two evacuation stations, or may not have an evacuation station.

The vacuum-side mechanical unit 235 includes process chambers 205, 206, 207, 208, 209, 210, transport chambers 214, 215, 216, and buffer rooms 212, 213. The process chambers 205, 206, 207, 208, 209, 210 perform processes such as etching and deposition on wafers. These chambers are connected to the transport chambers 214, 215, 216, respectively, via gate valves 222, 223, 224, 225, 226, 227. The gate valves 222, 223, 224, 225, 226, 227 can be opened and closed to partition and communicate spaces inside the process chambers and spaces inside the transport chambers.

The transport chambers 214, 215, 216 include vacuum robots 217, 218, 219, respectively. The vacuum robots 217, 218, 219 include hands that can hold wafers, and robot arms can be expanded and contracted, rotated, and moved vertically to transport wafers to a load lock, a process chamber, and a buffer room.

The buffer rooms 212, 213 are connected between the transport chambers 214, 215, 216, and include a mechanism to hold a wafer. With the vacuum robots 217, 218, 219 placing wafers in the buffer rooms 212, 213 and taking out wafers from the buffer rooms 212, 213, wafers can be passed and received among the transport chambers. The buffer rooms 212, 213 are connected to the transport chambers 214, 215, 216, respectively, via gate valves 228, 229, 230, 231. The gate valves 228, 229, 230, 231 have valves that open and close, and can partition and communicate spaces inside the transport chambers and spaces inside the buffer rooms. It is of note that the vacuum-side mechanical unit 235 is merely an example, the device of the present invention is not limited to a device having six process chambers, and the number of process chambers may be less than or more than six. Also, although in the present embodiment, the device is explained as one in which two process chambers are connected to one transport chamber, the device of the present invention is not limited to a device in which two process chambers are connected to one transport chamber, but may be a device in which one process chamber is connected to one transport chamber or three or more process chambers are connected to one transport chamber. In addition, the device of the present invention is not limited to a device having three transport chambers, but the number of the transport chambers may be less than or more than three. Also, although in the present embodiment, the device is explained as one including a gate valve between a transport chamber and a buffer room, there may not be a gate valve.

The load lock 211 is connected to the atmosphere-side mechanical unit 234 and the vacuum-side mechanical unit 235 via gate valves 220, 221, respectively and can increase and decrease pressure between the atmospheric pressure and vacuum while retaining a wafer therein.

Figure 3:
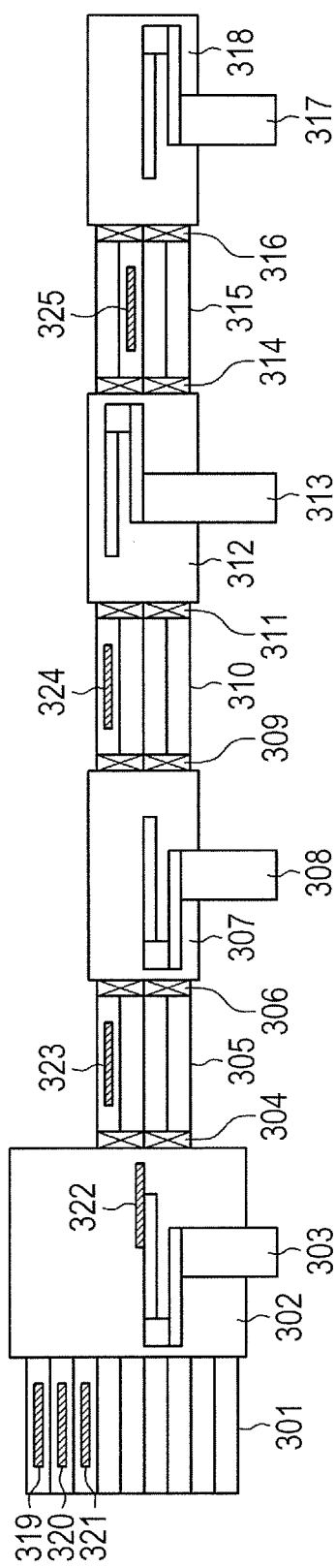
FIG. 3 is a diagram that explains a wafer holding structure of the mechanical unit of the semiconductor processing device.

Next, a structure to hold a wafer is explained with reference to FIG. 3 which is a bird's-eye view of the mechanical unit seen from a side surface thereof. A wafer can be held by a load lock 305 and buffer rooms 310, 315. These load lock 305 and buffer rooms 310, 315 hold a wafer at a structure that can hold a plurality of wafers separately (hereinafter, holding step). Although it is physically possible to place any wafer on any holding step, only unprocessed wafers are placed on some of holding steps, and only processed wafers are placed on some other holding steps in a general operation. This is because corrosive gas utilized for processes is adhered on processed wafers and may be left on holding steps, and when unprocessed wafers come into contact with the gas, the wafers may degenerate, degrading quality of the wafers. Accordingly, for example, in a case that there are four holding steps in a load lock as shown in FIG. 3, two steps are holding steps for unprocessed wafers, and remaining two steps are holding steps for processed wafers in an operation.

It is of note that a reference numeral 301 denotes a cassette (FOUP) placed in a load port; a reference numeral 302 denotes a housing that covers a movable area of an atmospheric robot; a reference numeral 303 denotes an atmospheric robot; reference numerals 307, 312, 318 denote transport chambers; reference numerals 308, 313, 317 denote vacuum robots; reference numerals 304, 306, 309, 311, 314, 316 denote gate valves; and reference numerals 319, 320, 321, 322, 323, 324, 325 denote wafers.

Figure 20:
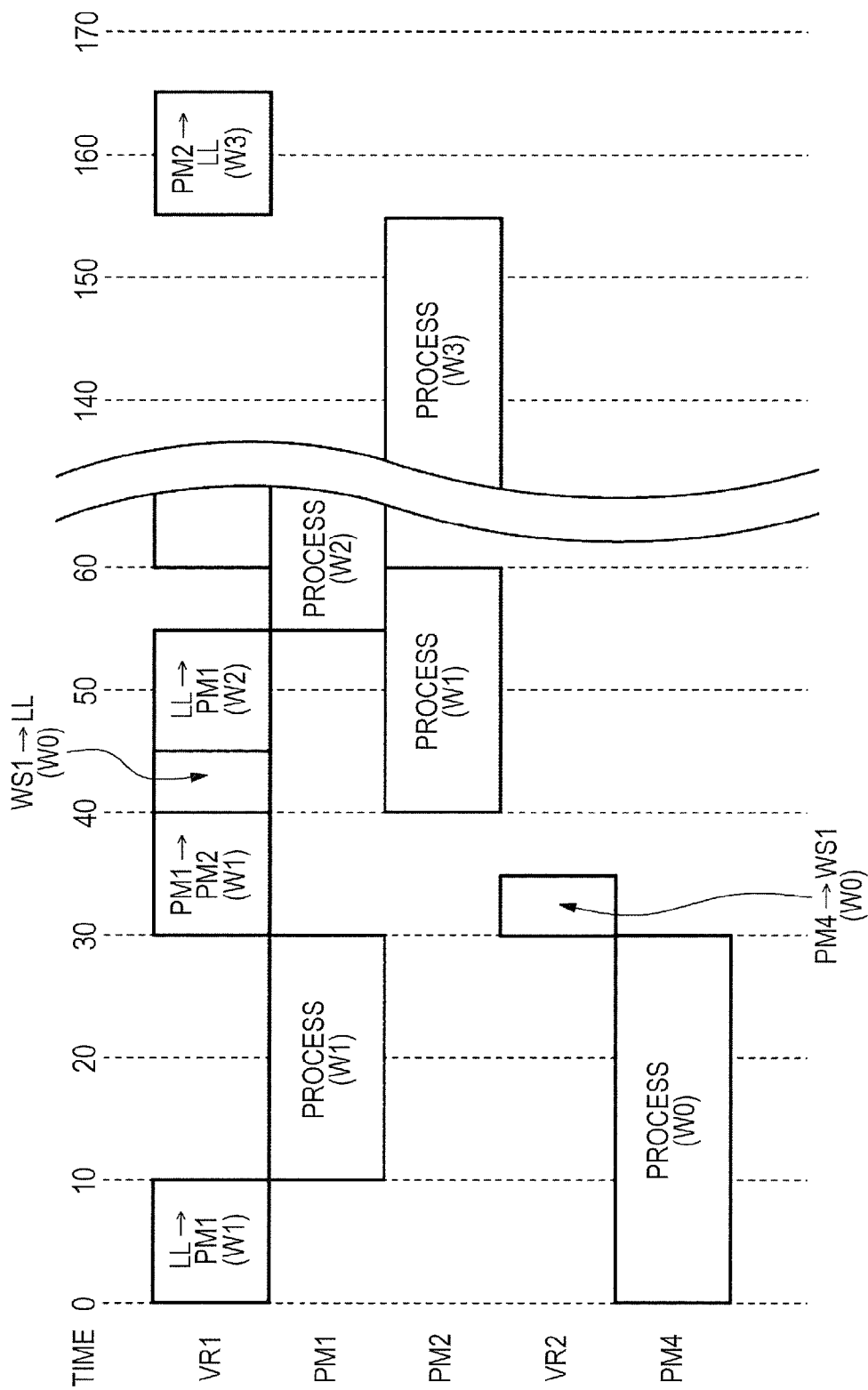
FIG. 20 is a diagram that explains an example of simulation.

Next, an overall flow of an action control system of the semiconductor processing device according to the present invention is explained with reference to FIG. 4. It is of note that, in the following explanation about the present embodiment, a linear tool handles a single step process that completes a process on a wafer by performing a single process in a designated vacuum process chamber, but the system can be expanded to a multiple-step process as a case of simulation in FIG. 20 shows an example of a two-step process of performing two processes in difference process chambers. Also, it is assumed that transportation is performed under an operation condition that a process chamber where a process is planned cannot be changed once transportation of a wafer is started from an initial position.

A user can select either "Manual" or "Automatic" for a control mode on a console screen 401, and a control mode setting unit 107 receives the selection, and starts control in the selected mode. Here, a process to be executed changes according to a selected control mode. For example, when "Manual" is designated as the control mode, manual transport destination setting 404 is executed. On the other hand, when "Automatic" is designated as the control mode, and conditions for a transport destination calculation trigger are met, a transport destination calculation 407 is executed. It is of note that in a case that the control mode "Automatic" is not cancelled, the transport destination calculation 407 is executed when conditions for a transport destination calculation trigger are met.

Both the arithmetic operation processes 404, 407 decide a transport destination process chamber for a wafer to be charged, and output transport destination information 405 as an output. Based on the transport destination information 405 and device state information 408, in action command calculation 409, an action command 410 is calculated, and a mechanical unit 411 performs an action based on the action command 410. Then, by performing the action, a state in the device changes, and the device state information 408 is updated. Then again, based on the transport destination information 405 and the device state information 408, in the action command calculation 409 launched by the update of the device state information 408, the action command 410 is calculated, and the mechanical unit 411 performs a next action.

Also, the arithmetic operation process 407 that decides a transport destination process chamber automatically is executed every time a transport destination for a new process subject wafer is decided, and updates the transport destination information 405. For example, when the atmospheric robot 203 ends transportation for placing a wafer on a load port, and enters a state that it can perform transportation of a new wafer, this triggers a launch of the transport destination calculation 407 to update a transport algorithm and execute the transport algorithm; thereby, a transport destination for the new wafer is calculated.

The present invention relates to a control method when the control mode "Automatic" is selected, and hereinafter a control method when the control mode "Automatic" is selected is explained. Accordingly, the transport destination deciding calculation means the transport destination calculation 407.

Figure 4:
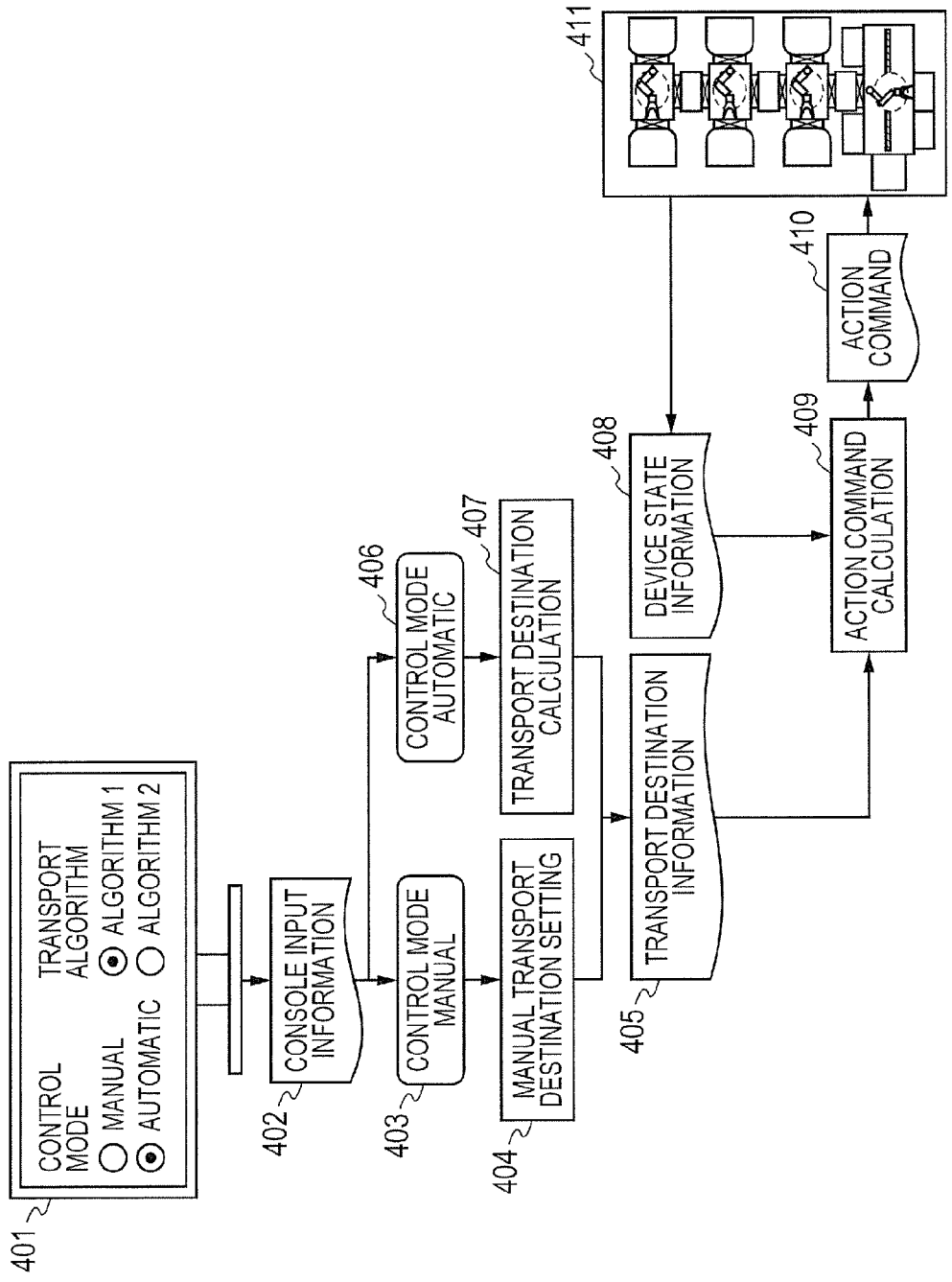
FIG. 4 is a diagram that explains an overall flow of an action control system of the semiconductor processing device.
Figure 5:
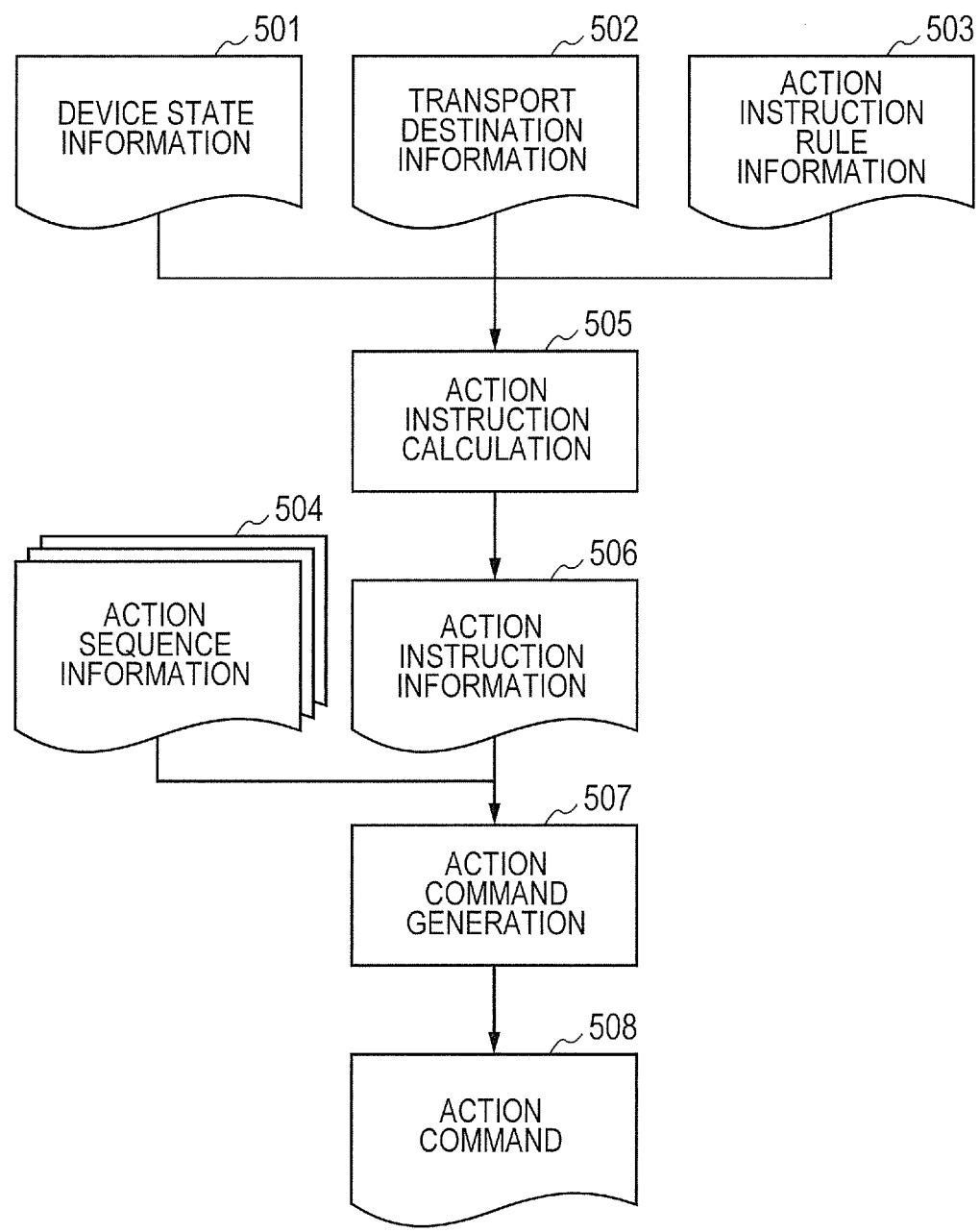
FIG. 5 is a diagram that explains a process and input/output information in action instruction calculation.

First, the action command calculation 409 shown in FIG. 4 is explained in detail with reference to FIG. 5. FIG. 5 is a diagram that shows a relationship between a process and input/output information of the action command calculation 409 executed by the action instruction calculating unit 108 in detail. The action command calculation 409 is configured with two arithmetic operation processes of action instruction calculation 505 and action command generation 507.

In the action instruction calculation 505, device state information 501, transport destination information 502, and action instruction rule information 503 are input to output action instruction information 506.

The device state information 501 (112) is exemplified in FIG. 11, and has data items of a "portion" column identifying a portion on which a wafer is placed, a portion in which a wafer is processed, or a portion that grips a wafer; a "state" column identifying a process or a state of activation of the portion; a "wafer number" column identifying a wafer that is placed on, processed in, or gripped by the portion, or availability; and a "wafer state" column representing a state of a wafer shown in the "wafer number" column. For example, data "portion: load lock 211_step 1, state: vacuum, wafer number: W11, wafer state: unprocessed" shows a state of a first step among the holding steps in the load lock 211 and means that the load lock is in a vacuum state, a wafer with a wafer number W11 is held, and the wafer W11 is an unprocessed wafer. Here, a wafer that has not been processed is an "unprocessed" wafer, a wafer that is currently being processed in a process chamber is an "in-process" wafer, and a wafer that has been processed is a "processed" wafer. A sensor is attached to each of the portions of the mechanical unit of the semiconductor processing device according to the present invention, senses a change in a state of each of the portions, or confirms a change of the wafer state when the vacuum robot passes a wafer, and at each time point, the device state information 501 (408, 112) is updated about a state of each portion or a wafer state.

The transport destination information 502 (116) is exemplified in FIG. 12, and identifies a transport destination process chamber for each wafer.

The action instruction rule information 503 (117) is exemplified in FIG. 13, and has data items of an "action instruction" column for transportation of a wafer at a starting point of transportation to a transport destination, and an "action instruction condition" column describing conditions that have to be met for performing the transportation in the "action instruction" column. For example, an action instruction "transport from the load lock 211 to the buffer room 212" means that the instruction is followed when conditions that "there is an unprocessed wafer whose transport destination is other than the process chambers 205, 206 in the load lock 211, and the load lock 211 is in a vacuum state", "there is an available holding step in the buffer room 212", and "at least one hand of the vacuum robot 217 is in a stand-by state" are met.

The action instruction information 506 (114) is exemplified in FIG. 14, has data items of transporting portion, transport subject, starting point of transportation, and transport destination, and has action instructions of transportation and wafer numbers of transport subject wafers.

In the action instruction calculation 505, the device state information 501 and the transport destination information 502 are referred to, an action instruction for which all action instruction conditions of the action instruction rule information 503 are met is extracted, and the action instruction is output as the action instruction information 506.

In the action command generation 507, the action instruction information 506 and action sequence information 504 are input to output an action command 508, and the action command is transmitted to the mechanical unit.

The action sequence information 504 (115) is exemplified in FIG. 15. The action sequence information 504 (115) describes a specific action content of each portion for the action instruction such as an action of the atmospheric robot and the vacuum robot, an opening/closing action of gate valves of a load lock, a buffer room, and a process chamber, and an action of a pump that vacuums a load lock, and means that actions are executed starting with that with the smallest action order number. The action sequence information 504 is defined associated with each action instruction.

In the action command generation 507, for the action instruction read out from the action instruction information 506, action sequence data of the corresponding action instruction is extracted from the action sequence information 504, and is transmitted as the action command 508 (410) to the mechanical unit starting with that with the smallest action order number.

Figure 6:
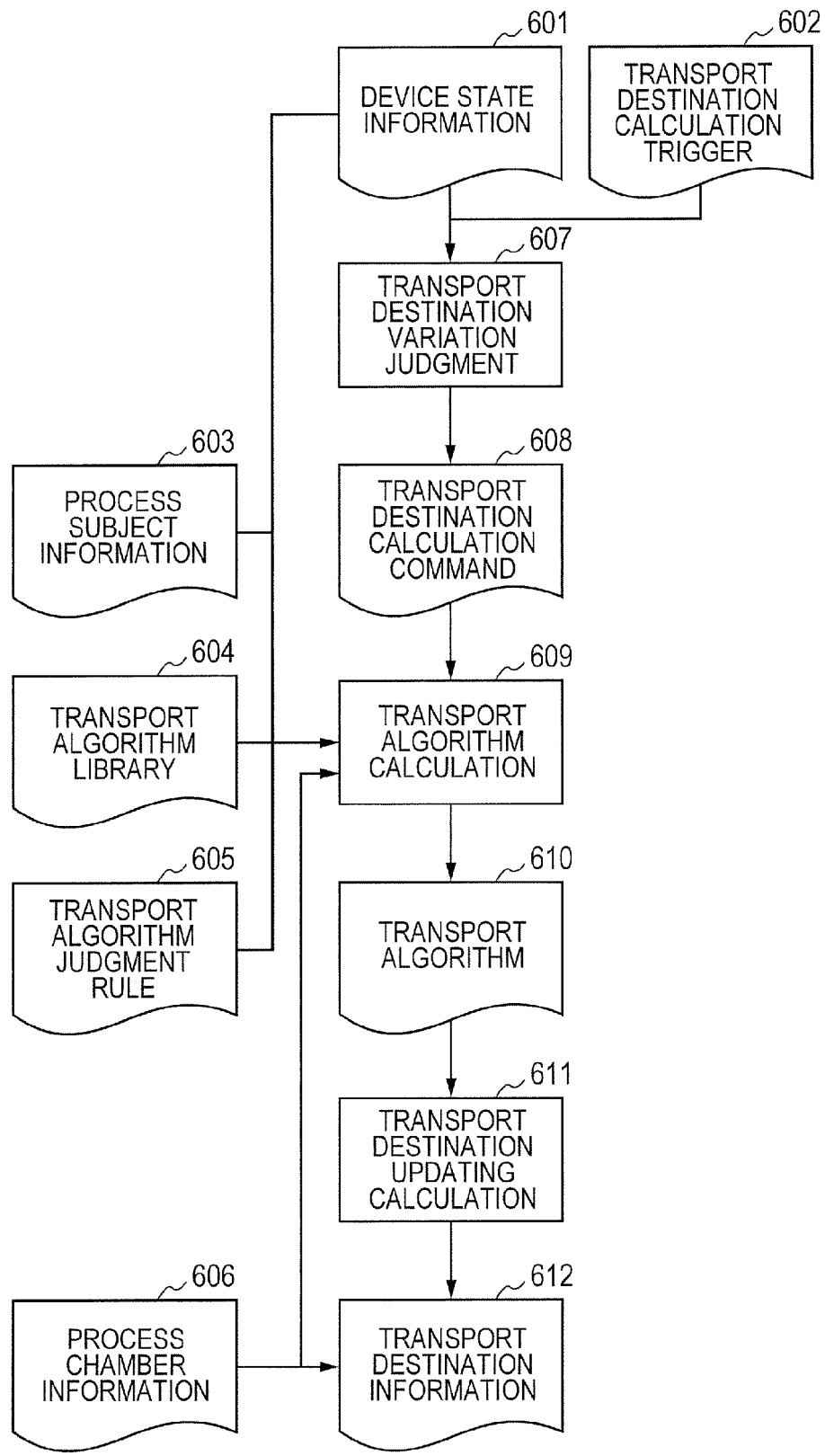
FIG. 6 is a diagram that explains a process and input/output information in transport destination calculation.

Next, the transport destination calculation 407 shown in FIG. 4 is explained in detail with reference to FIG. 6. FIG. 6 is a diagram that shows a relationship between a process and input/output information of the transport destination calculation 407 in detail. The transport destination calculation 407 is configured with three arithmetic operation processes of transport destination variation judgment 607, transport algorithm calculation 609, and transport destination updating calculation 611.

Figure 7:
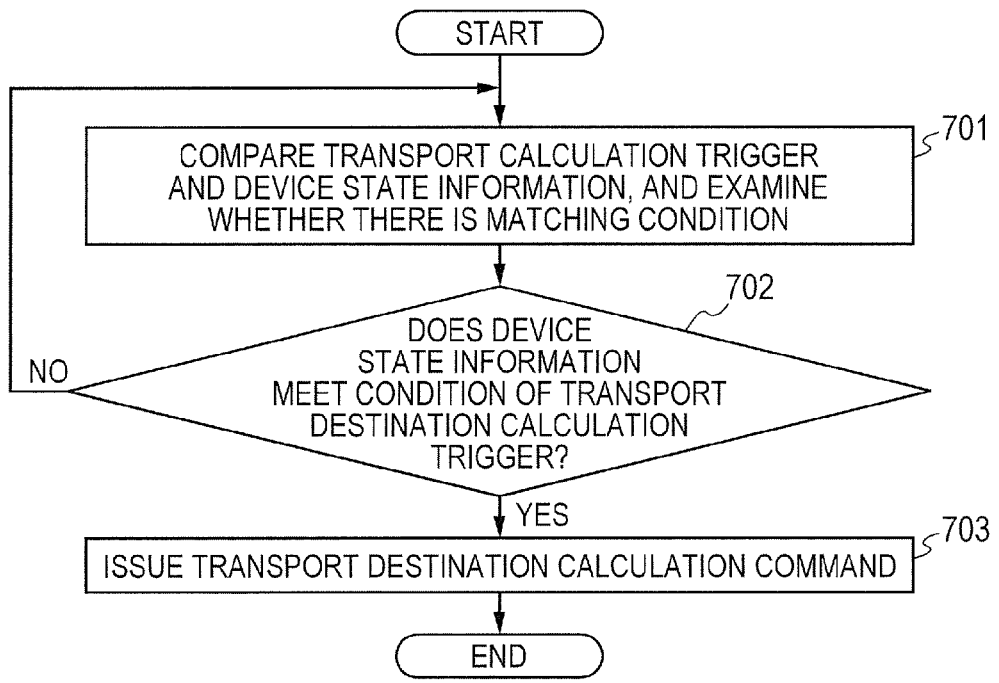
FIG. 7 is a flowchart that explains a detailed calculation process in transport destination variation judgment.

In the transport destination variation judgment 607 executed by the transport destination variation judgment calculating unit 110, device state information 601 (112) and transport destination calculation triggers 602 are input to output a transport destination calculation command 608. FIG. 7 shows a flowchart of the transport destination variation judgment 607. First, at a process step 701, the device state information 601 and the transport destination calculation triggers 602 are acquired.

The transport destination calculation triggers 602 (121) are information exemplified in FIG. 16, and include portions of the device, and information about events at the portions. When the device portion described in the transport destination calculation triggers 602 enters a state of the event, an event signal is issued from the device, and the result is reflected in an update of the device state information 601 (112). When the device state information 601 and the transport destination calculation triggers 602 are compared with each other, and a record (portion and state) of device state information that matches with a record (portion and event) in the transport destination calculation triggers 602 is discovered, the transport destination calculation command 608 is output. When a matching condition is not discovered, the device state information 601 is updated routinely, and examination is repeated.

In the transport algorithm calculation 609 executed by the transport algorithm calculating unit 109, the transport destination calculation command 608 is received, and the device state information 601, process subject information 603 (113), a transport algorithm library 604 (119), and transport algorithm judgment rules 605 (120) are input to output a transport algorithm 610.

The process subject information 603 (113) is exemplified in FIG. 17, and is information in which wafer numbers and process time of process subject wafers are described.

The transport algorithm library 604 (119) is exemplified in FIG. 18, and is information in which transport algorithms and decision conditions of transport destinations based on each transport algorithm are described. In FIG. 18, algorithms in which ratios of the numbers of pieces transported by each vacuum robot are varied are shown as an example of the transport algorithms. Here, the number of wafers (L1) transported to the process chambers 205, 208 by the vacuum robot 217, the number of wafers (L2) transported to the process chambers 206, 209 by the vacuum robot 218, and the number of wafers (L3) transported to the process chambers 207, 210 by the vacuum robot 219 shown in FIG. 2 are compared with each other to calculate the ratio, L1:L2:L3. When a ratio is 0, the corresponding vacuum robot does not transport a wafer. For example, when L3 is 0, the vacuum robot 219 does not transport a wafer. Furthermore, between two process chambers to which a wafer is transported by a same vacuum robot, a process chamber with the smallest number, e.g. the process chamber 205 among the process chambers 205, 208, is prioritized, and wafers are transported to each of the process chambers alternately. Also, among process chambers with different links, a vacuum robot with the smallest number, e.g. the vacuum robot 217 between the vacuum robots 217, 218, is prioritized, wafers are transported by the vacuum robots 217, 218, and 219 in this order one by one, and thereafter transportation is performed in the same order as long as a condition about the ratio of the numbers of pieces is satisfied. At this time, if the ratio is L1:L2:L3=2:1:1, after each vacuum robot transports a single wafer, the vacuum robot 217 transports another wafer to a process chamber, and the same action is repeated. Although in FIG. 18, transport algorithms using ratios of the numbers of pieces transported by the vacuum transportation robots are explained, the transport algorithm may be such that a wafer is transported to a process chamber in order every time a process in the process chamber ends, and the transport algorithms are not limited to the ones that are shown in FIG. 18. The transport algorithm library 604 (119) may be stored in advance in the storage unit 106 or may be stored in the host computer 104 as a database and searched therefrom.

The transport algorithm judgment rules 605 (120) are information exemplified in FIG. 19, and information in which conditions for selecting a transport algorithm with high throughput from among conditions such as the numbers and arrangement, and process time of active process chambers are described. A data table of rules shown in FIG. 19 summarizes transport algorithms with the highest throughput that are selected in advance in the host computer 104 by deciding conceivable combinations of the numbers and arrangement of process chambers, setting process time of each process chamber corresponding to a type of a wafer, executing simulation using each transport algorithm registered in the transport algorithm library under each setting condition, and assessing the throughput, the selected transport algorithms being associated with throughput values based on each transport algorithm.

Here, the simulation means a calculation procedure of juxtaposing actions that are performed in turn at each time. As a calculation example of the simulation, simulation is performed assuming that when a lot on which wafers with wafer numbers W1, W2, W3 are mounted arrives at the semiconductor processing device, another lot is in process, a wafer with a wafer number W0 in the lot is in process in the process chamber 4, and remaining process time is 35. Also, a rule is that wafers are charged in the order of W1, W2, and W3. To simplify the explanation, in this example, an action of an external transporting portion and an action of a gate valve are omitted, and only actions of the transportation robot and the process module are simulated.

In the following, the action simulation is explained with reference to FIG. 20.

Hereinafter, a load lock is abbreviated as LL, a process chamber PM, a vacuum robot VR, and a buffer room WS. First, a process starts at time 0 when W1 is stored in LL, a wafer is not stored in PM1, PM2, and W0 is stored in PM4 and is in process. In this case, an action start condition for VR1 to carry W1 out of LL into PM1 is met. Then, the action is juxtaposed as shown in the drawing. Next, one of the actions is completed, and the time is advanced to a time when there is a possibility that an action start condition changes. In this example, an action by VR1 of LL→PM1 (W1) requires time 10. Then, the time is advanced to 10. Here, it is checked whether there is an action that meets an action start condition. An action start condition for a process in PM1 is met because W1 is transported to PM1. Then, an action of a process on W1 in PM1 is juxtaposed with the time 10 as a starting point. Next, the time is advanced to 30 because process time for W1 in PM1 is 20. Here, the action is juxtaposed with the time 30 as a starting point because an action condition for an action by VR1 of PM1→PM2 (W1), and an action start condition for VR2 of PM4→WS1 (W0) after completion of a process on W0 in PM4 are met. Next, when the time is advanced to 35, an action by VR2 of PM4→WS1 (W0) completes. Here, although there is not an action for which action start conditions are met, a condition that there is a processed wafer in WS1, which is one of action start conditions for VR1 of WS1→LL (W0), is met, and the process waits for a state that VR1 does not hold a wafer. Here, it is assumed that at time 40, an external transporting portion stores W2 in LL. Then, when the time is advanced to 40, VR1 no longer holds a wafer, and action start conditions for VR1 of WS1→LL (W0), for VR1 of LL→PM1 (W2), and for a process on W1 in PM2 are met, respectively. Here, WS1→LL (W0) and LL→PM1 (W2) are both actions of VR1, and cannot be performed simultaneously. Then, following a priority rule of prioritizing an action for which action start conditions are met earliest, the action by VR1 of WS1→LL (W0) is prioritized in this example because the action has waited for a state that a wafer is not held by VR1 from a time point of the time 35. Also, WS1→LL (W0) by VR1 and the process on W1 in PM2 end up being juxtaposed with the time 40 as a starting point because a process on W1 can be performed in PM2 in parallel. Next, when the time advances to 45, the action is juxtaposed with time 45 as a starting point because an action start condition by VR1 of LL→PM1 (W2) is met. This process of juxtaposing actions while advancing the time is repeated on all process subject wafers until all the actions of ending processes and carrying out the wafers to the outside are juxtaposed. In this example, juxtaposition of all actions ends by juxtaposing an action of transportation PM2→LL of W3 by VR1.

A completion time of an action whose completion time is the last among all actions can be obtained from a result of the simulation. Throughput that is the number of processed wafers per unit time can be computed by dividing the number of processed wafers by the required time because the time is required for transportation and process. For example, in the case of the example in FIG. 20, the last action is PM2→LL (W3) by VR1, and the time is 165. Accordingly, the throughput for a transportation route candidate number 1 is 3/165≈0.018. An estimated value of throughput shown in FIG. 19 can be obtained by performing the above-described simulation and throughput computation for all conceivable combinations of the number and arrangement of process chambers, and combinations of process time using all applicable transport algorithms in the transport algorithm library, and a transport algorithm is selected by comparing throughput values in each transport algorithm.

A first data record of the transport algorithm judgment rules 605 (120) in FIG. 19 means that, for example using the process chambers 205, 206, 207, 208, a predetermined number of wafers are charged such that process time in the process chambers 205, 206 is 25 (S) and process time in the process chambers 207, 208 is 10 (S), a transport algorithm 1 and a transport algorithm 2 are selected from the transport algorithm library, and a result obtained by executing simulation for each transport algorithm is that a throughput value of the transport algorithm 2 is the highest at 0.018, and therefore the transport algorithm 2 is selected. Similarly, various data records are created in advance, and stored as the transport algorithm judgment rules 605 (120) in advance in the storage unit 106 of the action control unit 102 of the semiconductor processing device. Alternatively, in another possible operation, the data records are not kept at the storage unit 106 of the action control unit 102, but transport algorithm judgment rules are kept in the host computer 104 that creates the transport algorithm judgment rules, and the transport algorithm judgment rules in the host computer 104 are referred to when the semiconductor processing device is active.

Also in the transport algorithm judgment rules in FIG. 19, although conditions for selecting a transport algorithm are for selecting a transport algorithm that includes high throughput, an index for selecting a transport algorithm is not limited to throughput. Furthermore, in FIG. 19, although estimated values of throughput are obtained in advance and held, the estimated values may not be recorded in a data table of the transport algorithm judgment rules because the values are not used at the time of an actual operation.

In the transport algorithm calculation 609, the device state information 601, process chamber information about activation states in process chamber information 606, and process time for each wafer in the process subject information 603 are read out, and a data record that suits a condition about process time in the transport algorithm judgment rules is searched for. For example, it is decided to use the process chambers 205 to 208 for a process of wafers this time, a data record in the second line of the transport algorithm judgment rules is searched because the process time of each wafer is 40 (s), and the "transport algorithm 1" is read out as a selected transport algorithm. The transport algorithm library 604 is searched using the selected "transport algorithm 1" as a keyword, and a condition "L1:L2:L3=1:2:1" for deciding a transport destination by a transport algorithm is read out, and is made to be the transport algorithm 610 to be executed.

The process chamber information 606 (118) is exemplified in FIG. 21, and shows an activation status and a process end history of each chamber. A status "Active" means that a process can be performed, and a status "Terminated" means that a process cannot be performed. Also, the process end history shows the order of processes that have ended. Here, when a process is not performed at all, numbers are given to process chambers starting with that with the smallest process chamber number. A detailed calculation process of the transport algorithm calculation 609 is described below.

In the transport destination updating calculation 611 executed by the transport destination decision calculating unit 111, the transport algorithm 610 is input, transport destination information 612 is updated, and the updated transport destination information 612 is output. A detailed calculation process of the transport destination updating calculation 611 is described below.

Figure 8:
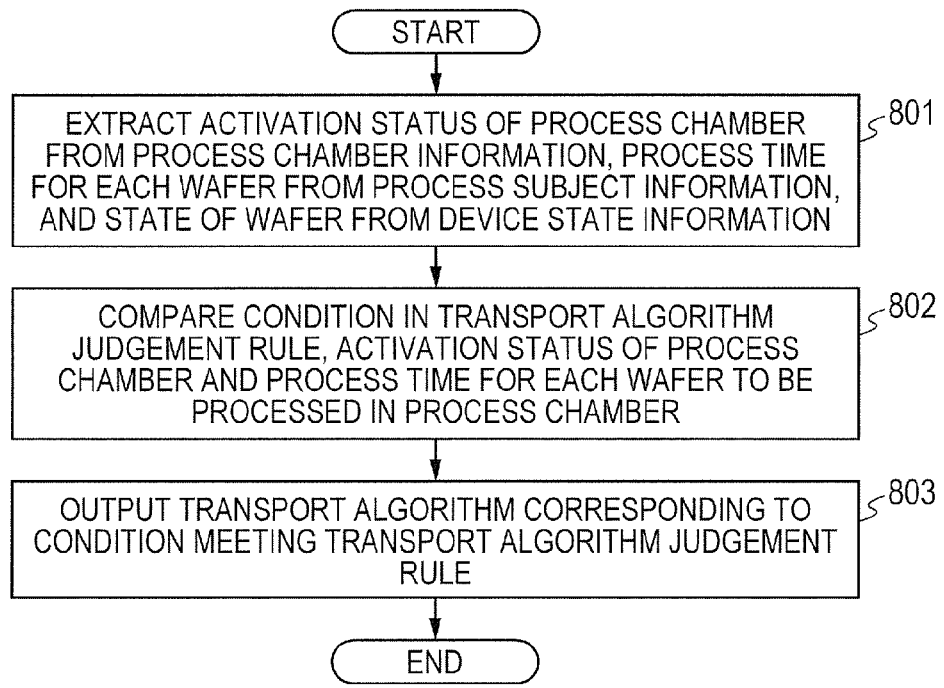
FIG. 8 is a flowchart that explains a detailed calculation process in transport destination algorithm calculation.

Next, the detailed calculation process of the transport algorithm calculation 609 shown in FIG. 6 is explained with reference to a flowchart of FIG. 8. In the transport algorithm calculation 609, a transport algorithm is selected as an algorithm for deciding a transport destination of a wafer. First, at a process step 801, information about an unprocessed wafer in the cassette (FOUP), an activation status of each process chamber, and process time for each wafer is extracted from the device state information 601, the process chamber information 606, and the process subject information 603, respectively. Next, at a process step 802, the activation status of each process chamber and the process time of an unprocessed wafer remaining in the cassette acquired at the process step 801 are compared with conditions in the transport algorithm judgment rules 605. The number of times of the comparison between the process time and the conditions equals the number of the process chambers that are judged to be active based on an activation status of each chamber, and the comparison is executed by extracting process time starting with an unprocessed wafer remaining in the cassette with the smallest number. For example, when there are four active process chambers, four unprocessed wafers remaining in the cassette with the smallest numbers are selected, and process time thereof and conditions of algorithm judgment rules are compared to select a transport algorithm. Next, at a process step 803, when the activation status of each process chamber and the process time of an unprocessed wafer remaining in the cassette meet conditions as a result of the comparison with conditions of the transport algorithm judgment rules 605, a corresponding transport algorithm is extracted from the transport algorithm library 604.

Figure 9:
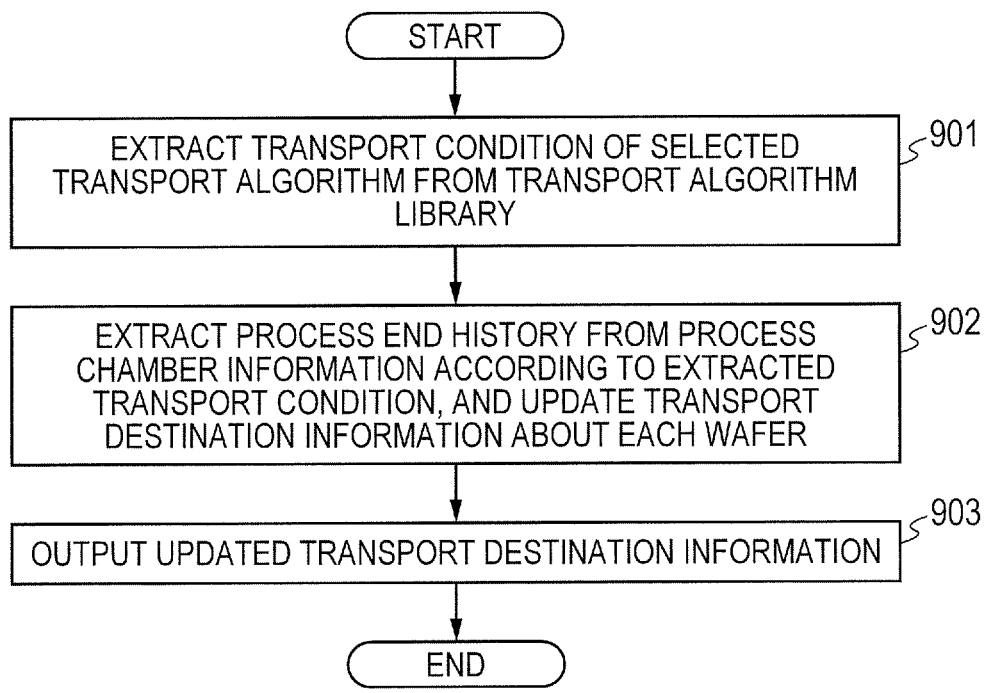
FIG. 9 is a flowchart that explains a detailed calculation process in transport destination variation calculation.

Next, the detailed calculation process of the transport destination updating calculation 611 shown in FIG. 6 is explained with reference to a flowchart of FIG. 9. First, at a process step 901, in a process of the transport algorithm calculation 609, transport conditions of the selected transport algorithm are extracted from the transport algorithm library 604. Next, at a process step 902, the transport destination information about each wafer is updated while extracting a process end history from the process chamber information 606 according to the extracted transport conditions. With these processes, the updated transport destination information 612 is output at a process step 903.

Here, the device state information 601 and the process chamber information 606 explained with reference to FIG. 6 are information obtained by monitoring the mechanical unit, and are routinely updated; also, the process subject information 603 is downloaded from the host computer when a cassette containing process subject wafers arrives at the load port.

Figure 10:
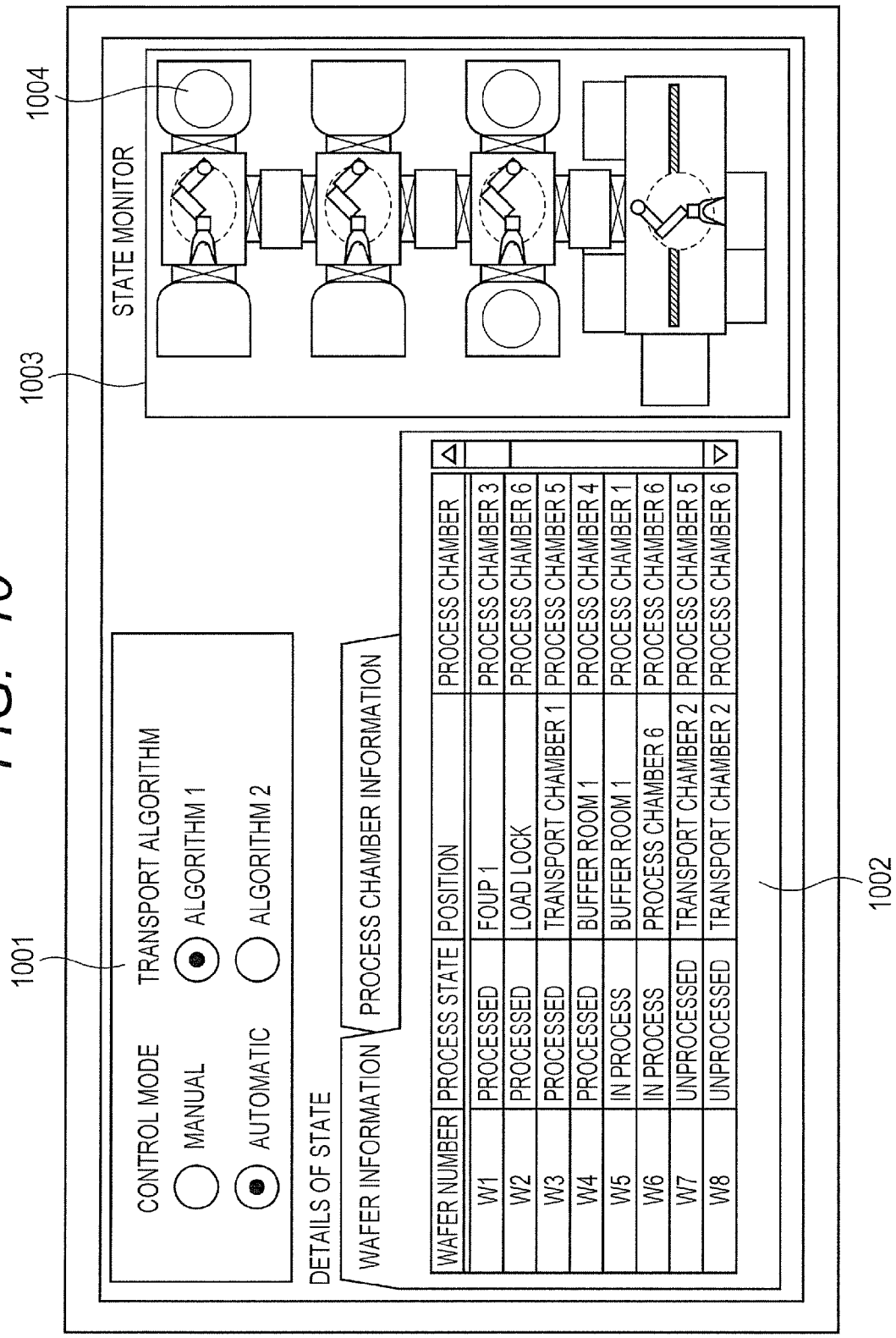
FIG. 10 is a diagram that shows an example of a screen in a console terminal.

Finally, the screen of the console terminal 103 shown in FIG. 1 is explained with reference to FIG. 10. The console terminal 103 includes an input unit including a keyboard, a mouse and a stylus, and an output unit including the screen. The screen includes an area 1001 in which a control method is selected, an area 1002 that displays an outline of a device state, and an area 1003 that displays detailed data of the device state. A control mode of either "Manual" or "Automatic" can be selected in the area 1001 in which the control method is selected. Furthermore, when "Automatic" is selected as the control method, whether to handle process chamber uncertainty can be selected. The area 1002 that displays an outline of the device state displays visually the device and a position of a wafer so that it can be grasped where a wafer is easily and conveniently. When the wafer moves, the display position of the wafer is varied accordingly. A circle in the area 1003 in the drawing shows a wafer 1004. Also, the area 1003 that displays the detailed data of the device state displays a detailed state of a wafer in the device and a detailed state of process chambers and the transportation mechanism.

What is claimed is:

1. A vacuum processing device comprising:
   a load lock that takes in a process subject member placed on an atmosphere-side to a vacuum-side;
   a plurality of process chambers that are connected to a transport chamber provided on the vacuum-side and perform a predetermined process on the process subject member;
   a plurality of transportation mechanism units that include a vacuum robot that performs passing and transportation of the process subject member;
   a plurality of buffer rooms that interconnect the transportation mechanism units and in which the process subject member is placed to be relayed;
   a holding mechanism unit that is provided in the load locks and the buffer rooms and holds a plurality of the process subject members; and
   a control unit that controls passing and transportation of the process subject member,
   wherein the control unit updates in real time and holds device state information showing an action state of each of the process chambers, the transportation mechanism units, the buffer rooms, and the holding mechanism unit, the presence of the process subject member, and a process state thereof, the control unit having: a section that selects a transport algorithm from among transport algorithm judgment rules that are obtained by simulating in advance a plurality of transport algorithms for controlling transportation of the process subject member for each condition of a combination of the number and arrangement of the process chambers and process time of a process subject member based on the device state information and process time of the process subject member; and a section that computes a transport destination of the process subject member based on the selected transport algorithm.

2. The vacuum processing device according to claim 1, wherein the section of the control unit that selects the transport algorithm reads out process chamber information about an activation state from the device state information, and selects a transport algorithm that is predicted to provide a highest throughput value from among transport algorithm judgment rules that are obtained by simulating in advance a plurality of transport algorithms for controlling transportation of the process subject member for each condition of a combination of the number and arrangement of the process chamber and process time of a process subject member based on the device state information and process time of the process subject member.

3. The vacuum processing device according to claim 1, wherein, assuming that the transportation mechanism units are classified into a first transportation mechanism unit that performs direct passing and transportation of the process subject member from the load lock to the process chamber; a second transportation mechanism unit that receives the process subject member from the load lock via the first transportation mechanism unit and the buffer room, and passes and transports the process subject member to a process chamber; a third transportation mechanism unit that receives the process subject member from the second transportation mechanism unit via the buffer room, and passes and transports the process subject member to a process chamber; and an n-th transportation mechanism unit, a plurality of transport algorithms for controlling transportation of the process subject member is defined by a ratio of the number of the process subject members that are passed and transported to a process chamber by the first transportation mechanism unit; the number of the process subject members that are passed and transported to a process chamber by the second transportation mechanism unit; the number of the process subject members that are passed and transported to a process chamber by the third transportation mechanism unit; and the number of the process subject members that are passed and transported to a process chamber by the n-th transportation mechanism unit, the numbers of the process subject members being obtained by dividing the number of the process subject member transported from the load lock.

4. The vacuum processing device according to claim 3, wherein the section of the control unit that computes a transport destination of the process subject member computes a transport destination of the process subject member such that, based on the selected transport algorithm, the process subject members transported from the load lock are transported one by one starting from the transportation mechanism unit with a smallest number to meet the ratio of the numbers of the transport algorithm and in a case that a plurality of process chambers are connected to each of the transportation mechanism units, a passing and transport destination is decided in order for each process subject member starting from a process chamber with a smallest number.

5. A method of transporting a process subject member of a vacuum processing device, the vacuum processing device comprising:
   a load lock that takes in a process subject member placed on an atmosphere-side to a vacuum-side;
   a plurality of process chambers that are connected to a transport chamber provided on the vacuum-side and perform a predetermined process on the process subject member;
   a plurality of transportation mechanism units that include a vacuum robot that performs passing and transportation of the process subject member;
   a plurality of buffer rooms that interconnect the transportation mechanism units and in which the process subject member is placed to be relayed;
   a holding mechanism unit that is provided in the load locks and the buffer rooms and holds a plurality of the process subject members; and
   a control unit that controls passing and transportation of the process subject member,
   wherein the control unit:
   collects device state information showing an action state of each of the process chambers, the transportation mechanism units, the buffer rooms, and the holding mechanism unit, the presence of the process subject member, and a process state thereof based on sensor information about each portion or control information about the holding mechanism unit;
   compares a throughput value of a transport algorithm judgment rule that is obtained by simulating in advance a plurality of transport algorithms for controlling transportation of the process subject member for each condition of a combination of the number and arrangement of the process chambers and process time of a process subject member based on the device state information and process time of the process subject member to select a transport algorithm; and computes a transport destination of the process subject member based on the selected transport algorithm, and controls passing and transportation of the process subject member supplied from the load lock to each transport destination process chamber according to the transport destination of the process subject member.

6. The method of transporting a process subject member of the vacuum processing device according to claim 5, wherein, assuming that the transportation mechanism units are classified into a first transportation mechanism unit that performs direct passing and transportation of the process subject member from the load lock to the process chamber; a second transportation mechanism unit that receives the process subject member from the load lock via the first transportation mechanism unit and the buffer room, and passes and transports the process subject member to a process chamber; a third transportation mechanism unit that receives the process subject member from the second transportation mechanism unit via the buffer room, and passes and transports the process subject member to a process chamber; and an n-th transportation mechanism unit, a plurality of transport algorithms for controlling transportation of the process subject member is defined by a ratio of the number of the process subject members that are passed and transported to a process chamber by the first transportation mechanism unit; the number of the process subject members that are passed and transported to a process chamber by the second transportation mechanism unit; the number of the process subject members that are passed and transported to a process chamber by the third transportation mechanism unit; and the number of the process subject members that are passed and transported to a process chamber by the n-th transportation mechanism unit, the numbers of the process subject members being obtained by dividing the number of the process subject members transported from the load lock.

* * * * *